United States Patent [19]

Ichihara

[11] Patent Number: 5,157,344

[45] Date of Patent: Oct. 20, 1992

[54] DIGITAL QUADRATURE PHASE DETECTOR FOR ANGLE MODULATED SIGNALS

[75] Inventor: Masaki Ichihara, Tokyo, Japan

[73] Assignee: NEC Corporation, Tokyo, Japan

[21] Appl. No.: 797,200

[22] Filed: Nov. 25, 1991

[30] Foreign Application Priority Data

Nov. 24, 1990 [JP] Japan ................................ 2-318628

[51] Int. Cl.$^5$ .............................................. H03D 3/00
[52] U.S. Cl. ..................................... 329/336; 329/302;
329/306; 329/323; 329/341; 329/346; 375/80
[58] Field of Search ............... 329/300, 302, 304, 306,
329/308, 323, 336, 341, 342, 343, 345, 346;
375/80, 81

[56] References Cited

U.S. PATENT DOCUMENTS 4,528,511 7/1985 Smith ................................. 329/336
4,547,737 10/1985 Gibson ............................... 375/80 X
4,567,442 1/1986 Haussmann ......................... 329/336

Primary Examiner—Siegfried H. Grimm
Attorney, Agent, or Firm—Foley & Lardner

[57] ABSTRACT

An analog angle modulated signal is converted into a digital signal within an A/D converter using a sampling clock having a frequency an integer times higher than the carrier of the angle modulated signal. The digital signal is delayed by one sampling slot within each of four delay circuits connected in series to the A/D converter. The output of the A/D converter and that of the fourth delay circuit are multiplied by $-\frac{1}{2}$ within respective digital weighting circuits, and the multiplied outputs as well as the output of the second delay circuit are added together to generate an I component level signal. The output of the first delay circuit is multiplied by $-1$ within another weighting circuit and this multiplied output as well as the output of the third delay circuit are added together to generate a Q component level signal.

12 Claims, 2 Drawing Sheets

DIGITAL QUADRATURE PHASE DETECTOR FOR ANGLE MODULATED SIGNALS

FIELD OF THE INVENTION

This invention relates to a phase detection circuit that detects the phase changes of an angle modulated signal and derives an in-phase component level(I signal) and a quadrature component level (Q signal) of the input signal relative to a reference signal.

BACKGROUND OF THE INVENTION

Quadrature detectors are conventionally used as a means of detecting the phase changes of a high-frequency signal. An example of this kind of detector is shown in FIG. 2 where an input signal S1 is multiplied by the double-balanced mixers 21 and 22 using local signals S21 and S22, respectively. The signals S21 and S22 are generated by a local oscillator 23, and the phase of local signal S21 is shifted by a ninety degree phase-shifter 24, so that the phases of signals S21 and S22 are ninety degrees apart. The outputs S23 and S24 of mixers 21 and 22 are applied to low-pass filters 25 and 26, respectively, which remove the high frequency components of signals S23 and S24 and produce baseband signals S25 and S26 with phases which are orthogonal to each other. Based on a sampling pulse P, analog-to-digital (A/D) converters 27 and 28 convert S25 and S26, respectively, to digital signals which are then outputted as detection results or as I and Q signals.

The above process can be described by the following mathematical expressions. Let the input signal S1 be $$x = 2 \cdot A \cos(\omega_c t + \phi) \quad (1)$$

and let the local signals S21 and S22 be respectively $$y_{21} = \cos(\omega_c t),$$

$$y_{22} = -\sin(\omega_c t), \quad (2)$$

then, the outputs S23 and S24 of mixers 21 and 22 are respectively given by $$Z_{23} = x \cdot y_{21} = A \cos(2\omega_c t + \phi) + A \cos(\phi) \quad (3)$$

$$Z_{24} = x \cdot y_{22} = -A \sin(2\omega_c t + \phi) + A \sin(\phi). \quad (4)$$

where,
$\omega_c$: the angular frequency of the carrier of an input signal S1(radian/sec)
t: time (sec)
$\phi$: the phase of input signal S1(radian).
The values of the I and Q signals whose high frequency components are removed by the low-pass filters 25 and 26 are respectively $$I = A \cos(\phi), \quad Q = A \sin(\phi). \quad (5)$$

The phase $\phi$ can be derived from the I and Q signals according to the relationship, $$\phi = \tan^{-1}(Q/I). \quad (6)$$

The foregoing describes the principle behind the operation of a conventional quadrature detector.

The conventional quadrature detector described above has several problems as follows;

(1) It is very difficult to accurately implement the ninety degree phase-shifter (24 in FIG. 2). An error with the phase-shifter directly results in an error in the phase detection.

(2) Since it is difficult to accurately balance the two mixers 21 and 22, a DC off-set inevitably appears in the baseband signal. This also results in an error in the phase detection.

(3) An amplitude deviation appears where an unbalance occurs between the mixers 21, 22 and the low pass filters 25 and 26. This also causes an error in the phase detection.

To reduce these errors, a considerable amount of adjusting is required. Even if these adjustments are successful, the errors caused by fluctuations in the characteristic values of the devices as caused by temperature changes or aging cannot be prevented. In addition, the integration of analog circuits such as mixers, a ninety degree phase-shifter and low pass filters is difficult, making reductions in the size of the detector and power consumption difficult.

SUMMARY OF THE INVENTION

An object of the present invention is, therefore, to provide a phase detection circuit which easily solves the problems described above.

Another object of the present invention is to provide a phase detection circuit capable of eliminating a DC off-set contained in an input signal by using an A/D converter, delay circuits, adders and latches.

Yet another object of the present invention is to provide a phase detection circuit having no analog devices, such as a phase-shifter or mixer, and thereby eliminates phase errors ascribable to these devices.

A further object of the present invention is to provide a phase detection circuit implemented by digital circuits except for an A/D converter and thereby easily fabricated in a large scale integrated (LSI) circuit.

According to the present invention, there is provided a quadrature phase detection circuit comprising:

A/D converter means for converting a received analog angle-modulated input signal to a digital signal by using a sampling clock having a frequency n times higher than the carrier frequency of the input signal, where n is an integer;

a plurality of delay means connected in series for delaying sequentially the digital signal in synchronization with the sampling clock;

first adder means for weighting the digital signal and the outputs of the even numbered delay means from the A/D converter means with first and second predetermined values, respectively, and adding the weighted signals to produce a first added signal;

second adder means for weighting the outputs of the odd numbered delay from the A/D converter means with third and fouth predetermined values, respectively, and adding the weighted signal to produce a second added signal;

first latching means for latching the first added signal at a latching cycle m times longer than the cycle of the sampling clock, where m is an integer.

second latching means for latching the second added signal at the latching cycle; and means for supplying the outputs of the first and second latching means as phase detection outputs from the received input signal.

Preferably, each of the first and second adder means comprises a weighting circuit which shifts the digit of an input thereto or reverses the bits of the input.

DESCRIPTION OF THE DRAWINGS

The above and other objects, features and advantages of the present invention will become apparent from the following description referring to the accompanying drawings, in which.

DETAILED DESCRIPTION OF THE PREFERRED EMBODIMENT OF THE INVENTION

Figure 1:
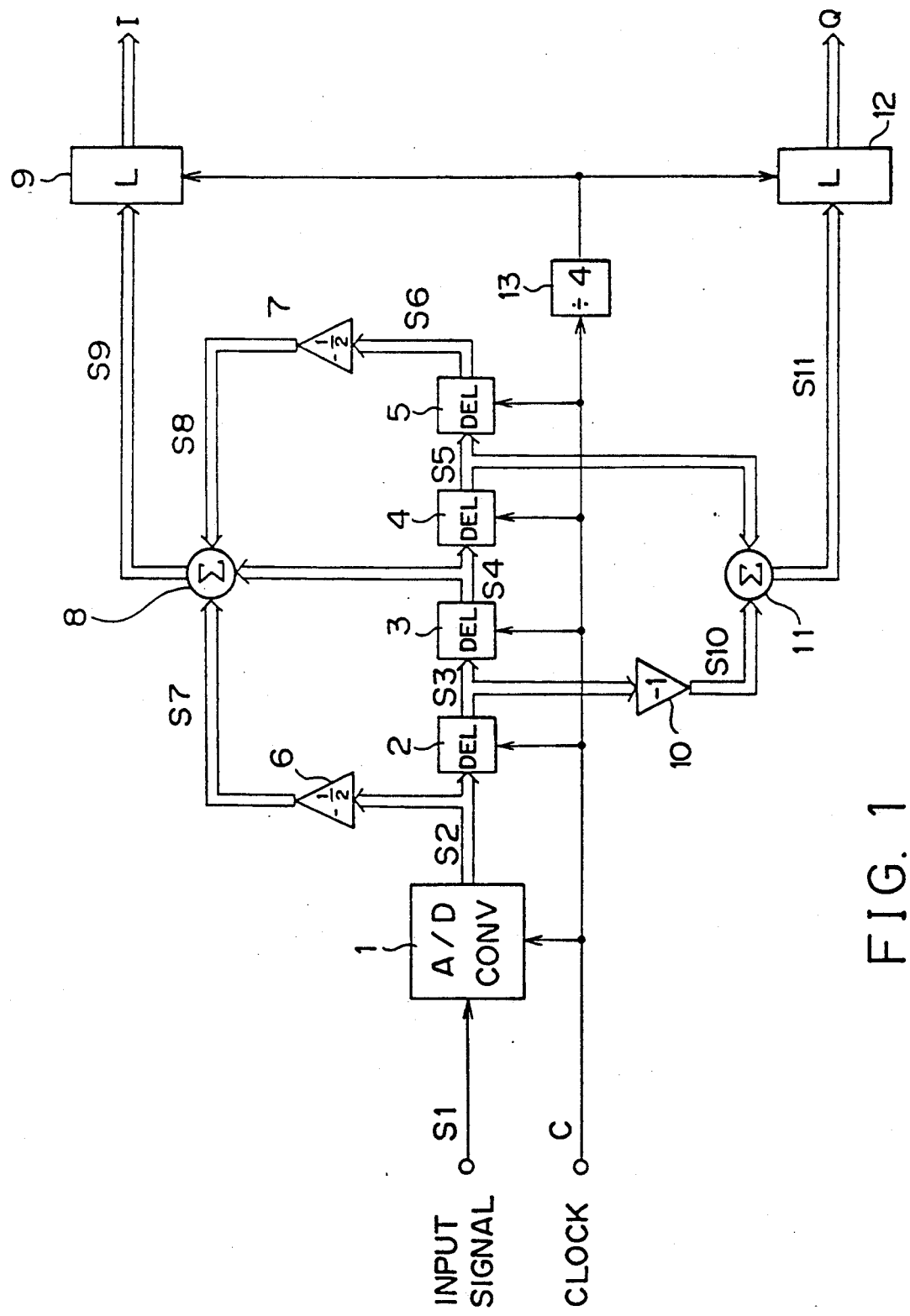
FIG. 1 is a block diagram illustrating a phase detection circuit accordingto an embodiment of the present invention.
Figure 2:
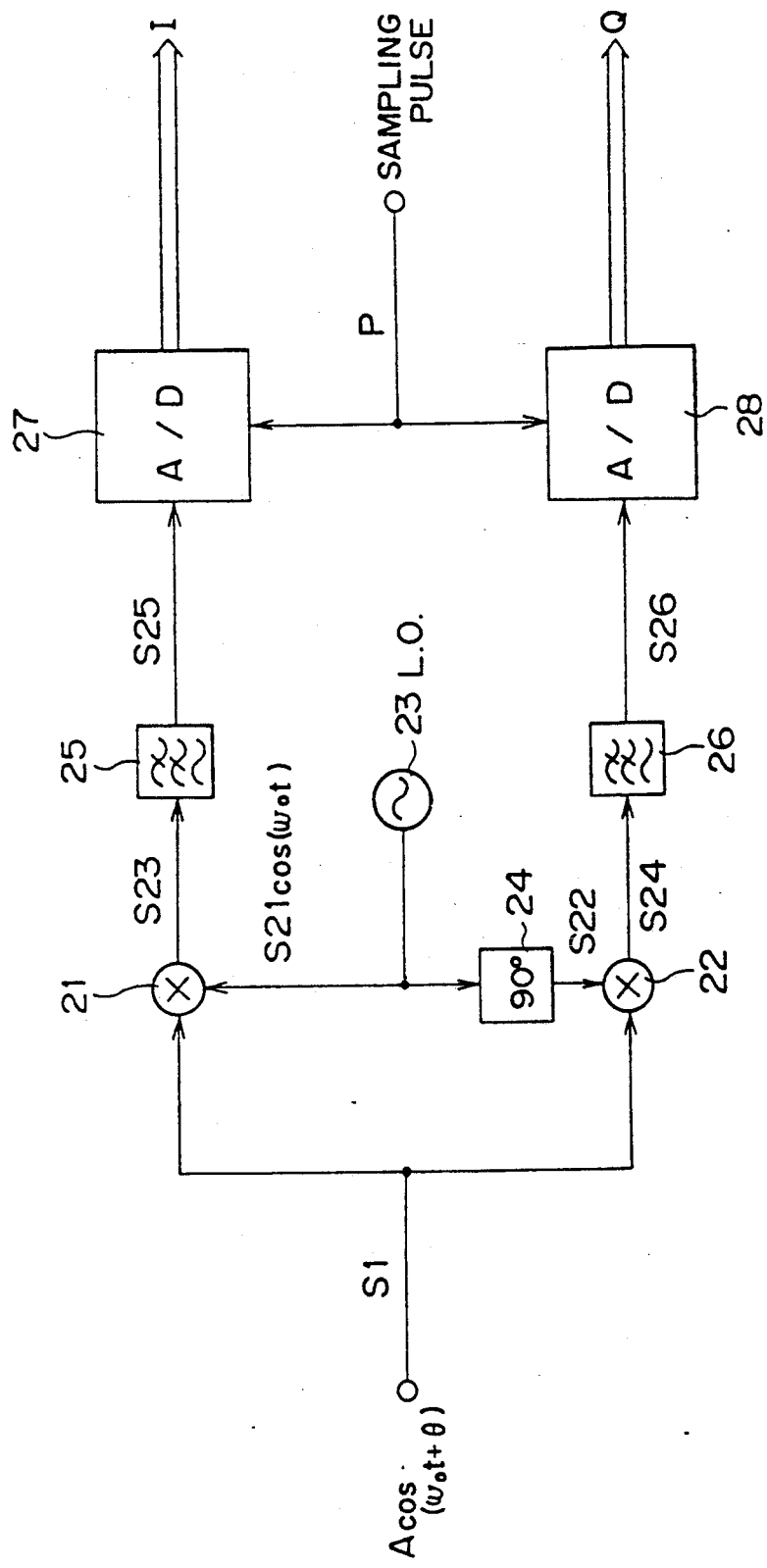
FIG. 2 is a block diagram of a conventional phase detection circuit.

In FIG. 1, an A/D converter 1 converts an input signal S1 to a digital signal S2 in synchronization with a sampling clock C having a frequency four times higher than the carrier frequency of signal S1. The digital signal S2 is delayed by one sampling cycle of clock C by delay circuits 2, 3, 4 and 5, respectively, which output respective delayed signals S3, S4, S5, and S6. The digital signal S2 is weighted by a weighting factor of $-\frac{1}{2}$ at a weighting circuit 6 to become a signal S7. The output S6 of the fourth delay circuit 5 is weighted by a weighting factor of $-\frac{1}{2}$ at a weighting circuit 7 to become a signal S8. The outputs S7 and S8 in addition to the output S4 of the second delay circuit 3 are added by a first adder 8, the output of which (S9) is latched to the first output latching circuit 9 at a cycle four times longer than the sampling clock cycle. This latching cycle is obtained by dividing the sampling clock C at a divider 13. The latched signal is outputted as an I signal(in-phase component level).

In addition, a weighting circuit 10 weights the output S3 of the first delay circuit 2 with a weighting factor of $-1$ to reverse the polarity of same and thereby to produce an output S10. The output S10 and the output S5 of the third delay circuit 4 are added by a second adder 11. The output of second adder 11 is then latched to a second output latching circuit 12 at the latching cycle provided from divider 13. This latched signal is outputted as a Q signal (quadrature component level).

The above-described operation can be described by the following mathematical expressions. Let the input signal S1 be $$x = A \cos(\omega_c t + \phi) + v, \quad (7)$$

and let the sampling timing within the A/D converter 1 be $$t = nT. \quad (8)$$

where, $$n = -\infty, \ldots, -2, -1, 0, 1, 2, \ldots, \infty. \quad (9)$$

$T = 2\pi/4\omega_c$: the sampling cycle (with the sampling frequency 4-times longer than the carrier frequency) (10)

$v$ = the DC off-set.

According to the above definitions, signals S2, S3, S4, S5, and S6 are respectively expressed as $$\begin{aligned} S2 &= A\cos(\omega_c nT + \phi) + v \\ S3 &= A\cos(\omega_c(n-1)T + \phi) + v \\ S4 &= A\cos(\omega_c(n-2)T + \phi) + v \end{aligned} \quad (11)$$

$$\begin{aligned} S5 &= A\cos(\omega_c(n-3)T + \phi) + v \\ S6 &= A\cos(\omega_c(n-4)T + \phi) + v \end{aligned}$$

Here, n=4m+k. Where,
$m = -\infty, \ldots, -2, -1, 0, 1, 2, \ldots, \infty$
$k = 0, 1, 2, 3,$
then, the expressions (11) become $$\begin{aligned} S2 &= A\cos(\omega_c(4m+k)T + \phi) + v \\ S3 &= A\cos(\omega_c(4m+k-1)T + \phi) + v \\ S4 &= A\cos(\omega_c(4m+k-2)T + \phi) + v \\ S5 &= A\cos(\omega_c(4m+k-3)T + \phi) + v \\ S6 &= A\cos(\omega_c(4m+k-4)T + \phi) + v. \end{aligned} \quad (12)$$

Substituting the expressions(10) into the expressions(12) and allowing the latching timing in the output circuits 9 and 12 to take place at the time when k=2, then each delay signal can be expressed as $$\begin{aligned} S2 &= A\cos(2\pi m + \pi + \phi) + v \\ S3 &= A\cos(2\pi m + \pi/2 + \phi) + v \\ S4 &= A\cos(2\pi m\phi) + v \\ S5 &= A\cos(2\pi m - \pi/2 + \phi) + v \\ S6 &= A\cos(2\pi m - \pi + \phi) + v \end{aligned} \quad (13)$$

or $$\begin{aligned} S2 &= -A\cos(\phi) + v \\ S3 &= -A\sin(\phi) + v \\ S4 &= A\cos(\phi) + v \\ S5 &= A\sin(\phi) + v \\ S6 &= -A\cos(\phi) + v \end{aligned} \quad (14)$$

Accordingly, the values that are latched within the output latching circuits 9 and 12 are $$\begin{aligned} I &= -S2/2 + S4 - S6/2 \\ &= -(A\cos(\phi) + v)/2 + A\cos(\phi) + v - (A\cos(\phi) + v)/2 \\ &= 2A\cos(\phi) \end{aligned} \quad (15)$$

$$\begin{aligned} Q &= -S3 + S5 \\ &= -(A\sin(\phi) + v) + A\sin(\phi) + v \\ &= 2A\sin(\phi). \end{aligned} \quad (16)$$

As a result, the phase $\phi$ is derived as $$\phi = \tan^{-1}(Q/I). \quad (17)$$

It should be noted that the weighting circuits 6, 7, 10 and the like can easily be realized by using circuitry that shifts the digits of the data or by bit reversing, and as a result no complicated multipliers are required.

As described above, the present invention enables quadrature phase detection of a phase modulated wave by using an A/D converter, delay circuits, adders and latching circuits, and the DC off-set voltage in the input signal is completely eliminated in the process, which in turn eliminates phase errors. Since no analog devices such as ninety degree phase shifters, mixers are used in the circuitry of the present invention, phase errors caused by the imperfection of such devices are eliminated. In addition, since circuits other than the A/D converter are implemented with digital circuits, and therefore large scale integration (LSI) technologies can be used, the invention is effective for reducing the size and power consumption of the quadrature phase detection circuit.

What is claimed is:

1. A digital quadrature phase detection circuit, comprising:

A/D converter means for converting a received analog angle-modulated input signal to a digital signal by using a sampling clock having a frequency n times higher than the carrier frequency of the input signal, where n is an integer;

a plurality of delay means connected in series for delaying sequentially said digital signal in synchronization with said sampling clock;

first adder means for weighting said digital signal and the outputs of the even numbered delay means with first and second predetermined weightings, respectively, and adding the weighted signals to produce a first added signal;

second adder means for weighting the output of the odd numbered delay means with third and fourth predetermined weightings, respectively, and adding the weighted signals to produce a second added signal;

first latching means for latching said first added signal at a latching cycle m times longer than the cycle of said sampling clock, where m is an integer;

second latching means for latching said second added signal at said latching cycle; and means for supplying the outputs of said first and second latching means as phase detection outputs from said received input signal.

2. A digital quadrature phase detection circuit as claimed in claim 1, wherein each of said first and second adder means comprises at least a weighting circuit for either shifting digits of an input thereto or reversing the bits of said input.

3. A quadrature phase detector comprising;

A/D converter means for converting an analog angle-modulated signal into a digital signal in synchronization with a clock signal;

first delay means for delaying said digital signal by one bit to produce a first delayed signal;

second delay means for delaying said first delayed signal by one bit to produce a second delayed signal;

third delay means for delaying said second delayed signal by one bit to produce a third delayed signal;

fourth delay means for delaying said third delayed signal by one bit to produce a fourth delayed signal;

first and second weighting means for weighting said digital signal and said fourth delayed signal with first and second weighting factors, respectively, to produce first and second weighted signals;

third weighting means for weighting said first delayed signal with a third weighting factor to produce a third weighted signal;

first adder means for adding said first and second weighted signals and said second delayed signal to produce a first added signal;

second adder means for adding said third weighted signal and said third delayed signal to produce a second added signal; and first and second latching means for respectively latching said first and second added signals with a latching signal having a frequency four times lower than the frequency of said clock signal to produce in-phase and quadrature component signals of said angle-modulated signal.

4. A detector as claimed in claim 3, further comprising means for frequency dividing said clock signal with a divisor of four to produce said latching signal.

5. A detector as claimed in claim 3, wherein said first, second and third weighting factors are $-\frac{1}{2}$, $-\frac{1}{2}$ and $-1$, respectively.

6. A detector as claimed in claim 3, wherein said angle-modulated signal is a four phase-modulated signal.

7. A detector circuit comprising:

A/D converter means for converting on analog angle-modulated signal into a digital signal with a clock signal;

a plurality of delay means connected in series to the output of said A/D converter means, each delaying an input thereto by one period of said clock signal;

a plurality of weighting means for weighting said digital signal and the outputs of said plurality of delay means;

first adder means for adding the weighted digital signal and the weighted outputs of even numbered delay means;

second adder means for adding the weighted outputs of odd numbered delay means; and first and second latching means for respectively latching the outputs of said first and second adder means in synchronization with a latching signal having a period m times longer than the period of said clock signal to produce in-phase and quadrature components of said angle-modulated signal.

8. A detector circuit as claimed in claim 7, wherein said plurality of delay means comprise first, second, third and fourth delay circuits connected in series to said A/D converter means for respectively delaying said digital signal by one period of said clock signal to produce first, second, third and fourth delayed signals, and wherein said plurality of weighting means comprise first, second and third weighting means for weighting said digital signal and said second and fourth delayed signals with first, second and third weighting factors, respectively; and fourth and fifth weighting means for weighting said first and third delayed signals with fourth and fifth weighting factors, and wherein said first adder means comprises means for adding the outputs of said first, second, and third weighting means, and wherein said second adder means comprises means for adding the outputs of said fourth and fifth weighting means.

9. A detector circuit as claimed in claim 8, wherein said first, second, third, fourth and fifth weighting factors are $-\frac{1}{2}$, 1, $-\frac{1}{2}$, $-1$ and 1, respectively.

10. A detector circuit as claimed in claim 9, wherein said m is four.

11. A method of detecting an analog angle-modulated signal to produce its in-phase (I) and quadrature (Q) components, said method comprising the following steps of;

converting said analog angle-modulated signal into a digital signal in synchronization with a clock signal having a frequency n times higher than the carrier frequency of said angle-modulated signal, n being a positive integer;

sequentially delaying said digital signal n times by one period of said clock signal each;

weighting said digital signal and the 2p-time delayed signals with a first set of predetermined weighting factors to produce a first set of weighted signals, p being 1, 2, . . . n/2;

weighting the (2p−1)-time delayed signals to produce a second set of weighted signals;
adding said first set of weighted signals to produce a first added signal;
adding said second set of weighted signals to produce a second added signal; and
latching said first and second added signals with a latching signal having a period n times longer than the period of said clock signal to produce said I and Q components, respectively.

12. A method as claimed in claim 11, wherein said n is four.

* * * * *